(12) United States Patent
Weitekamp et al.

(10) Patent No.: US 6,835,926 B2
(45) Date of Patent: Dec. 28, 2004

(54) MECHANICAL SENSORS OF ELECTROMAGNETIC FIELDS

(75) Inventors: Daniel P. Weitekamp, Altadena, CA (US); Bruce Lambert, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 84 days.

(21) Appl. No.: 10/123,084

(22) Filed: Apr. 12, 2002

(65) Prior Publication Data

US 2002/0162947 A1 Nov. 7, 2002

Related U.S. Application Data

(60) Provisional application No. 60/283,750, filed on Apr. 12, 2001.

(51) Int. Cl.[7] .................................................. H01J 3/14
(52) U.S. Cl. ...................................... 250/234; 250/225
(58) Field of Search .......................... 324/529; 73/104, 73/105; 250/225, 306, 307, 308, 309, 310, 311, 234

(56) References Cited

U.S. PATENT DOCUMENTS

| 5,623,205 A | | 4/1997 | Tomita et al. | |
|---|---|---|---|---|
| 5,998,995 A | * | 12/1999 | Osiander et al. | 324/259 |
| 6,000,280 A | * | 12/1999 | Miller et al. | 73/105 |
| 6,314,800 B1 | * | 11/2001 | Nishimura | 73/105 |
| 6,497,141 B1 | * | 12/2002 | Turner et al. | 73/105 |

OTHER PUBLICATIONS

Zenhausern et al., *Apertureless near–field optical microscope* Applied Physics Letter, 1994, vol. 65, No. 13, pp. 1623–1625.

Hamann et al., *Enhanced sensitivity near–field scanning optical microscopy at high spatial resolution*, Applied Physics Letters, 1998, vol. 73, No. 11, pp. 1469–1471.

Wickermansinghe et al. *Progress in scanning probe microscopy* Acta Mater., 2000, vol. 48 No. 1, pp. 347–358.

Averbukh et al., *Coherent near field optical microscopy*, Optics Communications, 2000, vol. 174, No. 1–4, pp. 33–41.

Novotny et al., *Theory of nanometric optical tweezers*, Physics Review Letters, 1997, vol. 79, No. 4, pp. 645–648.

* cited by examiner

*Primary Examiner*—Thanh X. Luu
(74) *Attorney, Agent, or Firm*—Fish & Richardson P.C.

(57) ABSTRACT

Sensing devices and techniques based on motion of a mechanical oscillator caused by electromagnetic interaction, such as a magnetic polarization with a magnetic field or an electric polarization with an electric field.

31 Claims, 6 Drawing Sheets

US 6,835,926 B2

MECHANICAL SENSORS OF ELECTROMAGNETIC FIELDS

This application claims the benefit of U.S. Provisional Application No. 60/283,750 filed Apr. 12, 2001, the entire disclosure of which is incorporated herein by reference as part of this application.

BACKGROUND

This application relates to mechanical sensors for sensing electromagnetic fields.

A material with an electromagnetic polarization can interact with a radiation field and may move, e.g., oscillate around an equilibrium position, due to the interaction. The movement of the material may be measured or monitored for a variety of applications including, among others, imaging and spectroscopy. In particular, this force-induced motion caused by electromagnetic interaction may be used to provide non-destructive measurements with high spatial resolution and high detection sensitivity. Examples of this type of devices include the scanning tunneling microscope, atomic force microscope, and near-field scanning optical microscope.

SUMMARY

This application includes sensing devices and techniques based on motion of a mechanical oscillator caused by electromagnetic interaction, such as a magnetic polarization with a magnetic field or an electric polarization with an electric field. Such devices may be used to detect or measure an electromagnetic field such as a RF signal or to detect or measure a sample which may have an inherent polarization or may be polarized in an external electromagnetic field.

BRIEF DESCRIPTION OF THE DRAWINGS

FIG. 2A shows a cross section view along the line AA' in FIG. 2B.

DETAILED DESCRIPTION

Mechanical oscillators or resonators may be engaged to a permanently polarized material as a probe to interact with a radiation field. The motion of the oscillators or resonators caused by the interaction may be used to measure the radiation field or the properties of an electromagnetically polarized sample material that produces the radiation field.

Figure 1:
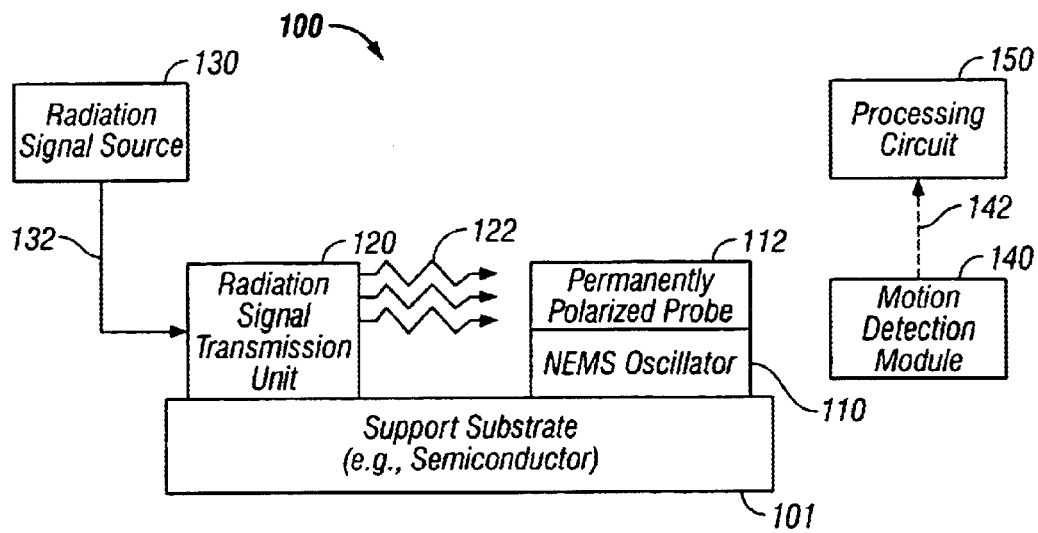
FIG. 1 shows one embodiment of a nanomechanical oscillator sensing system for measuring a RF signal.

FIG. 1 shows one embodiment of a micro sensor system 100 formed on a support substrate 101. The system 100 includes a micro mechanical oscillator 110 fabricated on the substrate 101. A permanently electrically or magnetically polarized material 112 is engaged to the oscillator 110 to move with the oscillator 110. This structure may be designed and fabricated based on integrated circuit techniques to form a micro or nano electromechanical system (NEMS) to operate at a desired oscillator frequency range, e.g., in the RF spectral range from about a few hundred MHz to several GHz. In one implementation as will be described here in detail, the substrate 101 may be a semiconductor substrate (e.g., silicon). A micro mechanical suspension may be fabricated and integrated on the surface of the substrate 101 as the oscillator 110.

The probe material 112 may be either ferromagnetic to exhibit a static magnetic dipole moment, or ferroelectric to exhibit a static electric dipole moment. Since the best known ferroelectric materials have electric, dipole moments greater than the magnetic dipole moments in the beet known ferromagnetic materials (e.g., approximately by an order of magnitude), ferroelectric materials may be preferred. In addition, it is desirable that the mass of polarized material should be small in order to respond at a high oscillation frequency. Hence, a ferroelectric material may be preferred because such ferroelectric materials are generally less dense than the ferromagnetic materials. In an alternative embodiment, the oscillator 110 may be formed of the probe material 112.

The system 100 also has a motion detection module 140 that detects the motion of the oscillator 110 and produces a signal 142 that has the information on the detected motion. A processing circuit 150, which may include a microprocessor, receives and processes the signal 142 to extract desire information from the signal 142. The motion detection module may be designed to optically measure the motion of the oscillator 110, e.g., by having a laser to illuminate the oscillator and detecting the scattered light from the oscillator. As described below, the oscillator may be coated with a reflective or scattering layer to enhance the optical reflection or scattering. Such optical monitoring is not invasive and does not require any physical engagement with the oscillator. Hence, the perturbation to the oscillator is minimized in comparison to other motion sensing systems such as the capacitive sensors. In addition, the optical monitoring allows the optical detector to be placed away from the oscillator without affecting the monitoring performance. In addition, optical detection of the RF-dipole-interaction-caused motion allows the integration of responses from separate resonators in a simpler way than is possible either electrically or through acoustic wave propagation.

In this embodiment shown in FIG. 1, the micro sensor is used to measure a radiation signal whose electric field interacts with the ferroelectric material 112 on the oscillator 110 to cause the oscillation. As illustrated, a radiation signal source 130 is used to send radiation signal 132 to a transmission unit 120. This transmission unit 120, in turn, outputs a radiation field 122 at the location of the probe 112 and the oscillator 110. For example, the signal 132 may be a RF voltage signal and the transmission unit 120 may include a pair of electrodes spaced from each other with a gap in which the probe 112 is located. The field 112 between the electrodes interacts with the probe 112 to cause the oscillator 110 to oscillate.

Figure 2A:
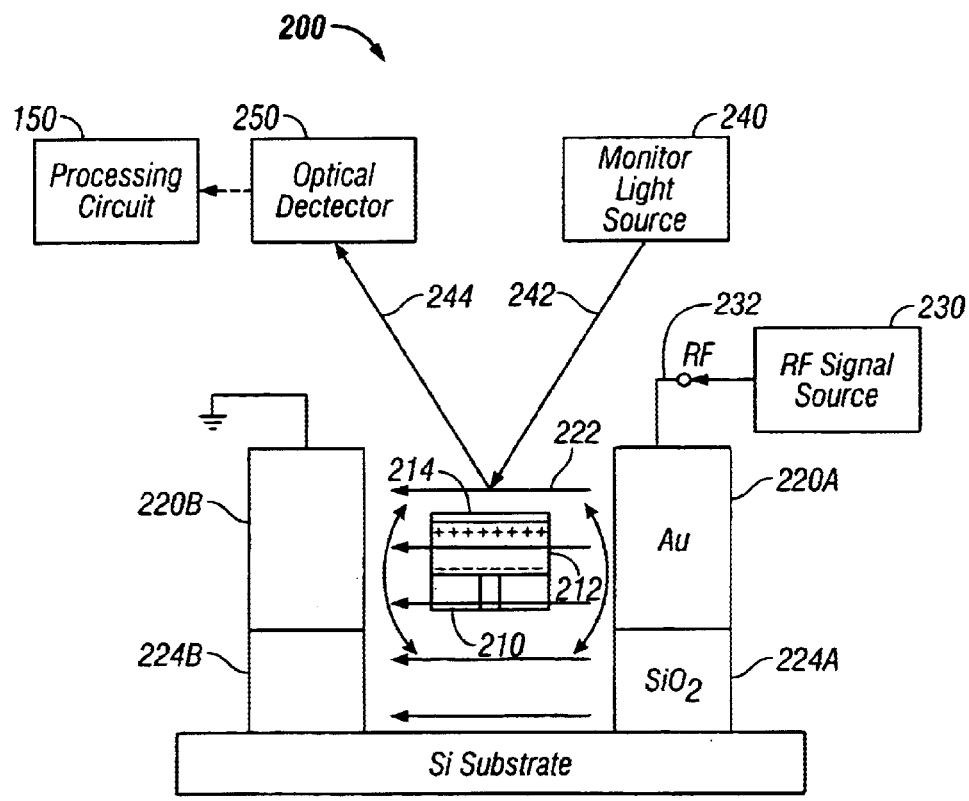
FIGS. 2A and 2B show one implementation of the system in FIG. 1 where
Figure 2B:
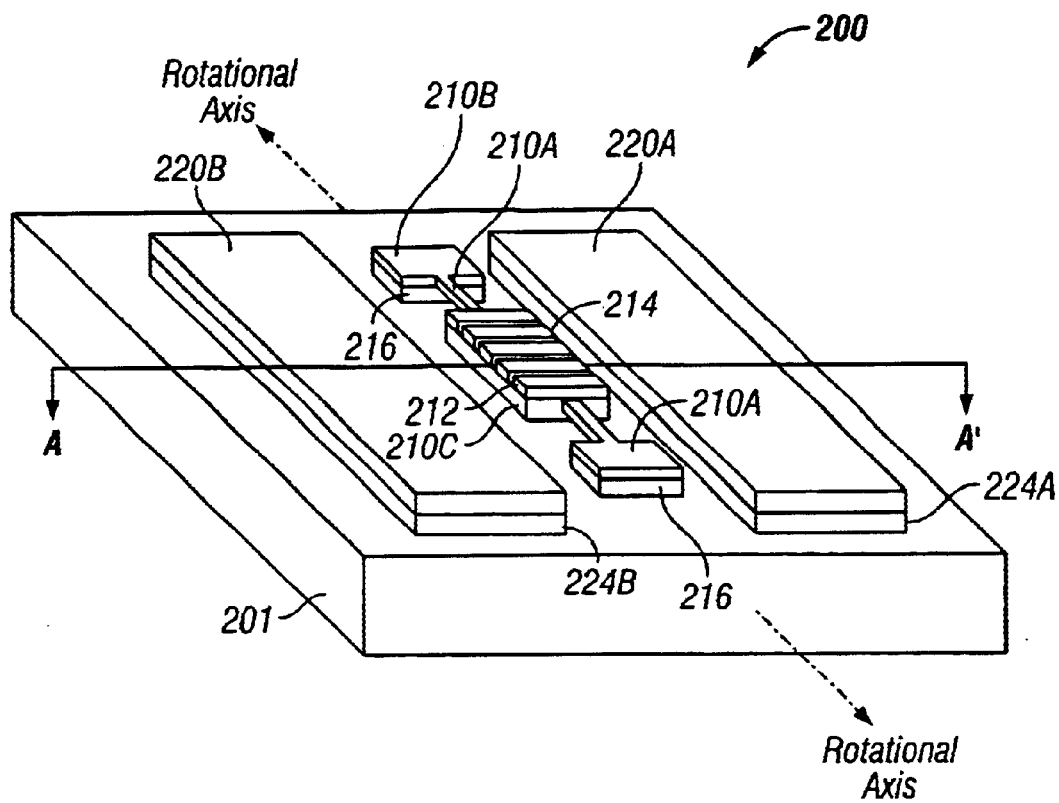

FIGS. 2A and 2B show one implementation 200 of the basic system 100 in FIG. 1 based on semiconductor integrated circuitry for measuring a RF signal. A semiconductor substrate 201 such as a silicon substrate is processed to form an integrated NEMS oscillator 210 with a ferroelectric material probe 212 formed on the oscillator. The top surface of the probe 212 is optically reflective or scattering for optical monitoring. An optically reflective or scattering layer 214, such as a metallic layer (e.g., gold), may be formed over the probe 212 to provide efficient optical reflection or scattering. Metallic nanoparticles may also be used to enhance optical scattering. A monitor light source 240, such as a diode laser, is used to produce an illumination beam 242 to the oscillator 210. The reflected or scattered beam 244 is collected by an optical detector 250 to produce a detector signal 252. The processing circuit 150 processes the signal 252 to measure the radiation field that interacts with the electric polarization of the probe 212.

The RF circuit of the system 200 is implemented as a simple two-terminal configuration. Two dielectric strips 224A and 224B are formed over the Si substrate 201 to be spaced from each other. The strips 224A and 224B may be silicon dioxide or silicon nitride. An electrically conductive units 220A and 220B are respectively formed over the strips 224A and 224B to operate the electrodes that receive the RF signal 232 from a RF signal source 230. As illustrated, the electrode 220A may be coupled to the source 230 and the electrode 220B may be electrically grounded. The electrodes 220A and 220B may for example be the two elements of an RF transmission line in which the sensor is contained, or may be viewed as the two plates of a capacitor in which the sensor is contained, or may be viewed as the proximal termination of antenna segments extending away from the sensor to increase the area over which broadcast RF is received. In each case, the field 222 in the gap between the electrodes 220A and 220B interacts with the probe 212 to cause the motion of the NEMS oscillator 210. Metals such as gold may be used to form the electrically conductive units 220A and 220B. The RF signal source 230 may be an integrated circuit directly fabricated on the substrate 201. This system forms a basic two-terminal RF oscillator circuit and thus may be used in various RF applications.

Figure 2C:
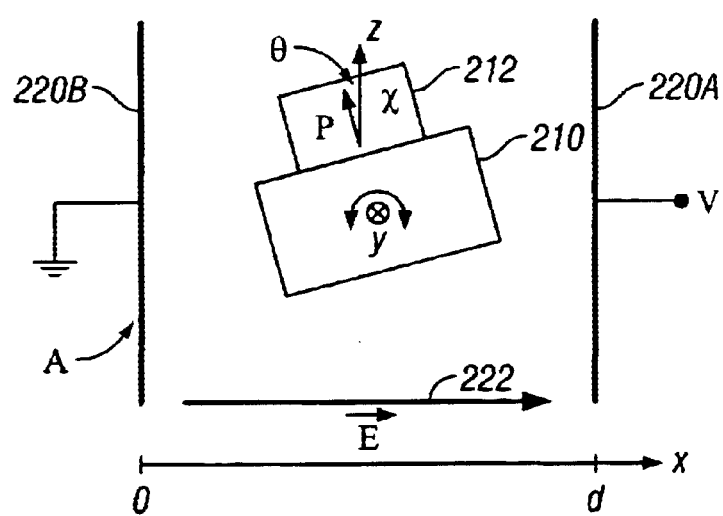
FIG. 2C shows a two-terminal electrical device having a nanomechanical oscillator to produce an impedance as a function of the oscillation of the oscillator.
Figure 2D:
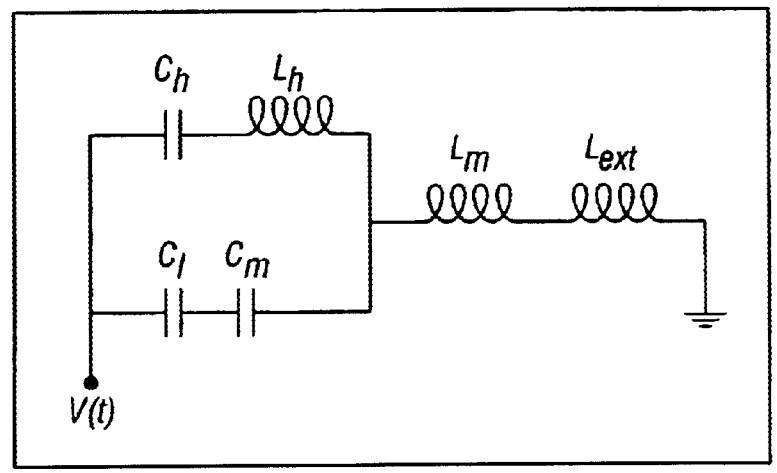
FIG. 2D shows a two-terminal electrical circuit analogous to the device in FIG. 2D.

When the resonator 110 is to be used as an element in a purely electrical circuit, the motion detection module and the associated optical detection elements including the light scattering elements 214, may be removed to simplify the system shown in FIG. 2A as a two-terminal system for coupling in an electrical circuit. FIG. 2C shows one embodiment of a two-terminal device based on a micro mechanical oscillator that interacts with the signal between the two terminals to oscillate. FIG. 2D shows an analogous two-terminal circuit. A broad range of applications of this purely electric type follow by analogy to piezoelectric rf components, such as those based on quartz crystals. Such devices provide a coupling between a mechanical resonance and motion of electrical charge. This coupling gives rise to a frequency-dependent impedance between two terminals which are electrodes 220A and 220B in this embodiment. This elementary frequency-dependent unit can be propounded into numerous devices such as stable oscillators, filters, and amplifiers. Notably, this two-terminal circuit with the mechanical oscillator 110 is different from many conventional piezoelectric devices. These conventional crystal devices usually rely on an intrinsic property of a certain class of crystals in which distortion of the crystal is associated with a proportional charge motion. In the present two-terminal device, the distorting element is predominantly the suspension (e.g. 210A) and need not be piezoelectric nor carry net charge. Furthermore, in the present devices, the electrical circuit with the two electrodes 220A and 220B is not physically engaged to the moving part, the mechanical oscillator 110. The current that flows between the terminals 220A and 220B is an alternating current proportional to the charge or dipole motion in the mechanical element 110 and mediated by the electromagnetic fields of the moving assembly. This separation of the mechanical moving part from the electrical circuit part reduces or eliminates deleterious effects of increasing the mechanical damping, especially when operating at high oscillating frequencies.

An example of an implementation that does rely on a piezoelectric crystal is where the mechanical resonator is comprised simply of such a crystal fixed between the electrodes to a substrate at one face and free to move at the opposite face, these faces being substantially parallel to the field to which the motion couples. In this arrangement, the motion is a shear mode motion of the free face along the direction of the field. There is an electrically detectable current between the terminals, a frequency dependent electrical impedance, and the additional possibility of optical detection of the motion enhanced by attaching scatterers to the free face.

The above oscillator-based two-terminal devices may be further extended to three terminal devices. For example, supplying in addition a field component parallel to the direction of the static dipole and at a frequency of approximately twice the resonator frequency leads to parametric amplification of the resonator motion. Such amplification can both increase the amplitude of the motion and narrow the range of frequencies near the resonator frequency so that the signals can be effectively detected. Thus both amplifier and filter functions are addressed by this three-terminal extension. An applied field component along the dipole moment direction may also be used to restore (pole) or realign the dipole moment should it be unstable or misaligned.

Notably, since the RF signal may be optically measured and monitored by the optical detector 250 at a location away from the NEMS oscillator and the associated IC circuit, the system 200 effectuates an "optical radio" which uses the beam 244 to optically send out information about the RF signal 232 to a distant or remote optical detector.

The system 200 may also be viewed as an efficient NEMS transceiver integrated circuit operating at a few hundred MHz to several GHz. It may be operated to couple the RF signal both into and out of the oscillator 210. The use of ferroelectric mechanical oscillator to couple to RF electric fields and the optical detection of the motion of the oscillator 210 via a NEMS analog of stimulated Raman scattering are combined. Such a device may be formed in an array of multiple identical sub systems, with the resonance frequency of the individual devices determined by the resonator dimensions.

The design shown in FIGS. 2A and 2B allows for low-power monolithic ICs containing complete transceiver systems. This design avoids a number of technical problems with silicon-based surface micromachining and capacitive transduction schemes where the capacitances at the required small resonator dimensions are too small in comparison to the parasitic capacitances. While the lithography of these nanometer-scale resonators is challenging, the input and output transduction mechanisms for such resonators are even more challenging. The oscillator design in FIGS. 2A and 2B allows for an oscillator operating frequency in a wide range of frequencies, including high frequencies that are not easily achievable in conventional mechanical oscillators, such as up to and including the GHz frequency regime.

The specific design shown in FIGS. 2A and 2B uses a torsional suspension design for the oscillator 210. Referring to FIG. 2B, two substantially identical support members 216 are formed on the substrate 201 between the gap along the electrode strips 220A and 220B to define the rotational axis of the oscillator 210. The support members 216 may be formed from silicon dioxide or silicon nitride. The oscillator 210 includes a center part 210C which may be a thin layer of a silicon or other suitable material to have an elongated shape along the electrode strips 220A and 220B. Two integrated narrow suspension arms 210A are formed on opposite sides of the central part along the longitudinal direction. In addition, two integrated suspension engagement parts 210B are respectively formed on the two support members 216 to suspend the center part 210C above the top surface of the substrate 201.

As illustrated, the direction of the electric dipole moment in the polarized material 212 is substantially perpendicular to the surface of the center part 210C and the substrate 201, and thus is substantially perpendicular to the electric field of the RF signal 222. In this configuration, the equal and opposite Coulombic forces on the positive and negative regions of the surface charge density to pull the top and bottom of the polarized block 212 in opposite directions by the RF electric field 222. This action causes the torsional torque around the rotational axis, which is the cross product of the ferroelectric dipole with the applied electric field. Under this torque, the resonator 210 oscillates in response to the RF field 222 with an angular amplitude around the rotation axis that scales with the signal strength of the RF field 222. Notably, when the frequency of the RF signal 222 is close to the mechanical resonance frequency of the oscillator 210, the amplitude of the torsional motion of the oscillator 210 is enhanced to make the system 200 highly sensitive. The optically reflective or scattering layer 214 is shown as gold metal bars perpendicular to the rotational axis of the oscillator 210 in this example. The variations in the angular orientation of the oscillator 210 change the light scattering properties of the bars. The photodetector 250 receives and detects the scattered beam 244 to measure this change.

The system 200 as a sensitive detector may be designed and operated to detect the motion of the oscillator 210 without appreciably degrading the intrinsic force sensitivity set by the thermal Brownian motion. The angular displacement, which is proportional to torque created by the interaction of the dipole moment of the ferroelectric block with the RF field, can be measured by detecting the optical field scattered quasi-elastically off the Au bars. This optical field is proportional to the resonator displacement. The use of photons for this purpose is intuitively appealing in part because no electrical conductive leads are needed to deliver the photons, and because photons from a coherent source such as a laser can be coherent over a desired device dimension, transfer little momentum, and are individually detectable.

These devices may be used to replace a variety of elements such as RF antennas, front-end filters, resonators, and voltage-controlled oscillator (VCO) passive elements in a typical RF transceiver. In some applications, for example, the system 200 may be used to replace bulky off-chip surface acoustic wave (SAW) filters or on-chip spiral inductors that do not scale well and occupy large areas of precious IC real estate.

For audiofrequency oscillators from micron scale to millimeter scale the Brownian motion limit has been closely approached by fiber optic interferometry. The analysis of such cases relies on the incident optical beam being efficiently reflected to the detector by the oscillator. Thus, it is not directly applicable to objects that have subwavelength extent in the directions perpendicular to the incident light and which are nearly transparent. In this regime interferometry goes over into stimulated Raman scattering. If the light is incident at optical local oscillator (LO) frequency $\omega d$ onto an oscillator driven at RF frequency $\omega f$, then the dominant signature of this phenomenon is the quasi-elastic scattering into optical sidebands at $\omega d \pm \omega f$ as the IF values. These sidebands may result from amplitude, phase, or polarization modulation of the nano-oscillator's optical polarization by its motion. Photon pressure fluctuations associated with this scattering are negligibly small for feasible incident light intensities. Thus, the process nonperturbatively produces optical fields that are faithful replicas of the oscillator amplitude. The challenge is to detect these replica fields without introducing uncertainty substantially larger than the Brownian uncertainty. Engineering goals include optimizing light scattering, efficiently collecting that light, and measuring it at close to the limit set by photon counting statistics (i.e., shot noise).

Due to high resonant frequencies of the NEMS oscillators as illustrated in FIGS. 2A and 2B in small dimensions, the fabrication of these resonators presents a significant lithography challenge. Estimates of resonator dimensions were made assuming a single-crystal Si paddle with bulk properties. The system 200 shows a single paddle torisonal oscillator or resonator. Triple paddle torsional resonators with three separate suspensions may be used to achieve larger length scales to reduce support losses. A double layer Si/LiNbO3 structure was assumed with each layer thickness being 50 nm, and with the LiNbO3 layer covering the entire paddle. (In practice, the LiNbO3 layer would not extend all the way to the supports, so as not to compromise the Q of the resonator.) The mass of the Au bars on the paddle, which are usually very thin and only cover the paddle partially, may be neglected in calculations. For example, a paddle width (along the axis) of 1000 nm with a corresponding paddle length (perpendicular to the axis) of 450 nm are sufficient to achieve a torsional resonance frequency of 300 MHz. For a resonance frequency of 3 GHz, if a paddle width of 200 nm is chosen, a corresponding paddle length of 160 nm may be used. While these dimensions are challenging, they are within the range of state-of-art electron beam lithography (EBL).

The system 200 may be designed to achieve a high sensing sensitivity, capability over the entire target spectral range, and flexibility to implement suitable RF modulation schemes within the operating spectral range. The combination of small resonators, optical scattering and detection, and modern digital signal processing and frequency synthesis may provide an approach to next generation radio hardware. Such designs based on the nanomechanical resonators and optical transduction schemes allows significant device miniaturization.

Notably, the NEMS oscillator system in FIGS. 2A and 2B may be used to form an oscillator array of multiple NEMS oscillators on a common substrate to achieve redundancy as a means of replacing the conventional RF antenna structure. In such an array, the response at a given frequency may have substantial contributions from a large number of individual resonators. Each resonator 200 may be driven by its electrode pair 220A and 220B, possibly augmented by conducting segments attached to one or both electrodes which act as conventional antennas to increase the cross section for interception of broadcast waves. The optical detection mechanism may be used to add the responses of these individual resonators to the broadcast signal, thus forming in effect an extended antenna largely constructed of material that is linked by an optical waveguide, rather than a RF waveguide as in a conventional antenna structure. As a result of the multiplicity of resonators, the receiver response at any given frequency may change very little if one or a few of the resonators are inoperative due to damage or otherwise. A higher signal-to-noise ratio may be achieved in such an array than for a single oscillator system. More importantly, in one implementation it finesses the problem of frequency instability of the oscillators with temperature, strain, aging or other slowly varying factors. Such frequency shifts may merely change the particular resonators contributing at a given frequency, while making little change in the response since the frequency dependence will be substantially flat. This strategy is feasible, and indeed easier, with the optical interconnection of the resonators to the photodiode; all resonators responding to a given Fourier component $\omega f$ of the signal field contribute coherently to the optical Fourier components at $\omega d \pm \omega f$. Since there is little momentum difference in the incident and scattered optical fields due to the quasi-elastic scattering of light by the oscillators, the phase difference between incident light and the scattered light at the photodiode varies with the position of the particular oscillator with a period typical of RF wavelengths, not the optical wavelength of the light. Thus, the constraints on the spacing of components, their mechanical stability, and the lengths of connecting cables are similar to ordinary RF design and are not challenging for the wavelengths of interest.

Figure 3A:
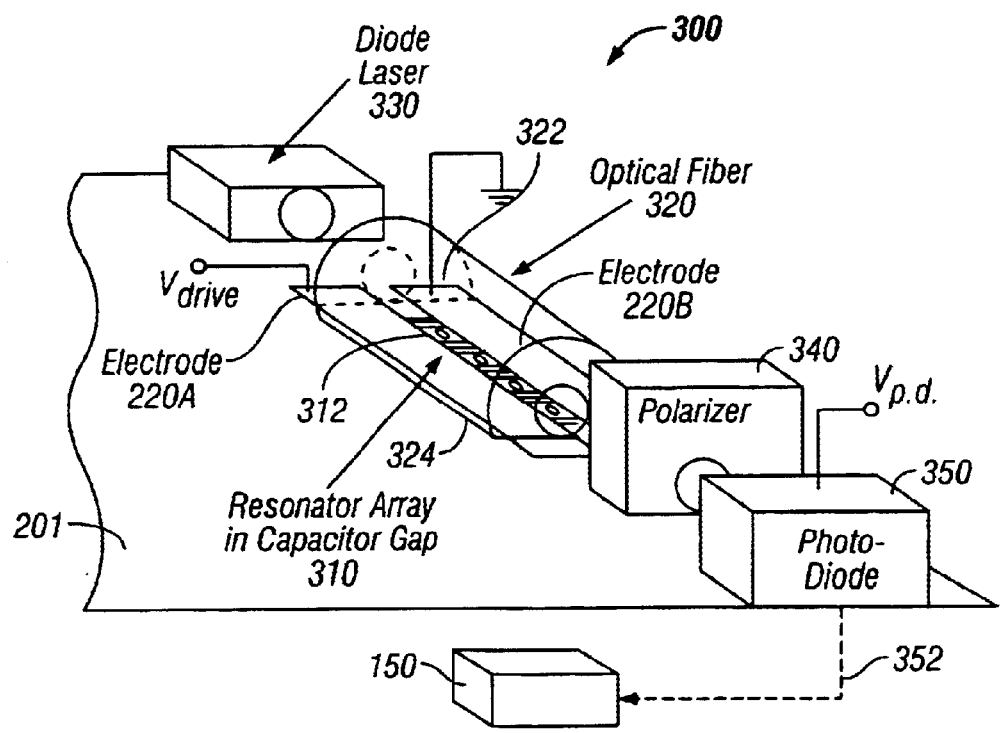
FIG. 3A shows one embodiment of an array system based on the single-oscillator design in FIGS. 2A and 2B.

FIG. 3A shows one embodiment of a nanomechanical resonator array sensing system 300 based on optical detection. The system 300 includes a resonator array of resonators 310 of multiple nanomechanical resonators 312 formed in a linear array. Alternatively, a two-dimensional array may also be used. Each resonator 312 may be the system 200 shown in FIGS. 2A and 2B and different oscillators may be fabricated on a common semiconductor substrate to receive the same RF signal. A laser 330, such as a diode laser mounted on the substrate may be used to illuminate the resonator array 310. An optical detector 350 is positioned, e.g., on the substrate, relative the to the array 310 to receive the scattered light from the array 310 to produce a detector output 352 coupled to the processing circuit 150.

The array system 300 is shown to use a 320 to implement the optical detection based on evanescent coupling. The fiber 320 is only one form of a general optical waveguide. Other optical waveguides such as a planar waveguide may be used to replace the fiber 320. The fiber 320 has one end to receive the light from the laser 330 and an opposite end to deliver light to the optical detector 350. A portion of the fiber cladding of the fiber 320 is removed and polished to form a side-polished optical surface 324 which is within the reach of the evanescent field of the guided light in the fiber core 322. The side-polished fiber 320 is mounted on the substrate for the array 310 to have its side-polished surface 324 positioned over the resonators 312 so that the resonators 312 are aligned along the fiber core 322 in the evanescent field of the guided light. The interaction of the guided light and the resonators 312 modifies the guided light to include the information about the mechanical positions of the resonators 312. The guided light is then coupled into the detector 350 for optical detection.

Optical fibers have lower mass and lower dissipation than low-loss coaxial cables, which could be a significant advantage for portable, rapidly deployable antenna arrays, including "smart" arrays that compensate for time-dependent multipath interference and shielding. Furthermore, since only optical power is needed at or returned from the location of a given mechanical oscillator, line-of-sight free space links are also possible between completely passive (and inexpensive) antenna/oscillator outposts and the optical receiver and digital components. In the case that the Brownian-noise limit has been closely approached in each station, modest optical losses on the way to the optical receiver are inconsequential to overall signal-to-noise ratio (SNR). This is in contrast to the need in existing RF receivers to have high-quality electrically powered preamplifier gain in close proximity to each antenna element in order to prevent severe degradation of SNR by any subsequent propagation.

The system 300 incorporates the antenna function of intercepting the broadcast RF energy and the input mixer function of converting the signal to the optical IF wave. The collection of energy is at the optical IF frequencies, thus eliminating the high mass and losses of large RF antennas. The LO and IF waves copropagate along the waveguide 320 with additional amplitude transferred to the IF at each driven oscillator.

As a specific example of how the resonator motion can couple the LO and IF waves in the array system 300, consider optical fields at a single resonator element of the array 310 by referring back to FIGS. 2A and 2B. The resonator is in the evanescent field of the waveguide 320 which is assumed here to be a single-mode optical fiber with the cladding removed on one side. The incident optical IF field is polarized along the normal to the oscillator plane, i.e., perpendicular to the plane of the substrate 201 and the surface of the center part 210C of the oscillator 210. The stimulated Raman process is the scattering at the LO frequencies into the orthogonal polarization. The source of the scattered IF field is the LO-induced dipole proportional to both the difference in the optical polarizability of the oscillator and its torsional amplitude. The gold bars perpendicular to the torsional rotation axis are placed along the resonator surface to form the layer 214 to enhance the optical anisotropy. The gold bars may be modeled as ellipsoids, and the LO laser is assumed to be resonant with the plasmon resonance in the near IR of the gold bars. This same microscopic physics applies to all resonators in the chain of oscillators along the waveguide and leads to a linear birefringence that is proportional to the instantaneous angular position of the oscillators. The situation is analogous to light propagating through a "waveplate" which is oscillating torsionally around the propagation direction.

Referring back to FIG. 3A, an optical polarizer 340 may be mounted on the substrate between the fiber 320 and the detector 350 to select only the light polarized along a direction perpendicular to the input polarization for detection by the detector 350. The intensity of the detector signal 352, hence, represents the angular amplitude of the oscillators 312 in the torsional motion in response to the same RF input signal to the oscillators 312. Alternatively, the signal from the detector 350 may be the component of the photocurrent that is proportional to the signal fields at the frequencies $\omega d \pm \omega f$ and to a mutually coherent reference field also incident on the detector. Such phase sensitive detection is well-known in other contexts to be valuable both in retaining phase information and in making detector noise unimportantly small relative to the signal. The optical detection of such oscillators may be engineered to meet a central challenge of NEMS, the observation of the motion without significant perturbation or measurement noise.

Figure 3B:
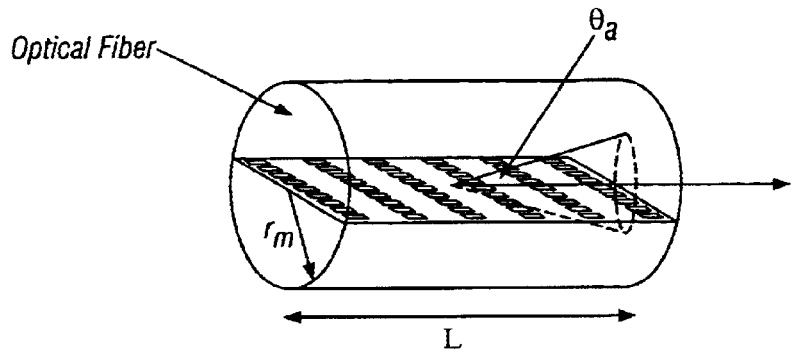
FIG. 3B shows a two-dimensional array system based on the design in FIG. 3A.

The resonator array 310 is illustrated as a one-dimensional array along the fiber 320 in FIG. 3A. In addition, the array may be a two-dimensional array within the extend of the evanescent field of guided light in the fiber. One example is illustrated in FIG. 3B.

The motion of the electrically or magnetically polarized oscillators or resonators may also be used to measure the properties of an electromagnetically polarized sample material that produces a radiation field. The following describes one embodiment of such a system based on electrically polarized oscillators by using ferroelectric materials. The basic designs and principles underlying the system may be used for a similar system with a magnetically polarized oscillator.

The following sections describe a scanning probe spectroscopy and imaging technique based on Electric Dipole-Difference Imaging (EDDI). The interaction between a permanent dipole on the probe tip and an optically-excited dipole in the sample drives a mechanical resonance of the probe. Analysis of the resultant force images can be used to provide spectrally-dependent orientational and positional information of the sample and the probe. Analysis of the force images will provide spectrally dependent, orientational and positional information. This technique is unique in its ability to image electromagnetic fields, for example of individual molecules, spectroscopically through the detection of forces. As with other forms of near-field optical spectroscopy, it finesses the usual spatial resolution limit set by the wavelength of light. Like magnetic resonance imaging and MRFM, it will deliver still finer positional information through shifts of spectroscopic resonances by fields of known spatial variation. An example as the field of the scanning probe tip itself due in large part to its dipole. Note that this is a distinct use of the dipole to conveniently create a spatially varying field at the sample, in distinction to its use as an element of the sensor driven by the field of the sample. The sensitivity and generality may be greater than such alternative methods. As a second-order spectroscopic method, the present system is insensitive to spectroscopic resonances of solvents and most bulk solids and can directly provide the vector orientation of chromophores. It may be viewed in some embodiments an a local probe of the second order polarizability of the sample which describes the polarization of the sample at the difference frequency between two Fourier components of the applied optical field. Unlike other method for probing electric fields at surfaces, no voltage difference is needed between sample and probe. Spectroscopic information can be obtained from ultraviolet to mid infrared wavelengths.

One aspect of this system is that the dimension of the probe, not the wavelength of the light, determines the spatial resolution. Hence, the imaging of forces can achieve a high imaging resolution. This technique may achieve lateral spatial imaging resolution of a few nanometers and both Brownian and quantum noise limits 1000 times better than that of analogous magnetic resonance systems. A system based on such EDDI may be capable of room-temperature single-molecule operation. Use of a thin vacuum wall to separate the cantilever (in vacuum) and a specimen at atmospheric pressure promises to allow imaging, spectroscopy, and 3D structure of individual functioning biomolecules and other micro substances. The criteria of sensitivity, spatial resolution, spectroscopic resolution, and massively parallel implementation may be simultaneously optimized. In addition, the physical dimension of the system may be readily miniaturized.

Figure 4:
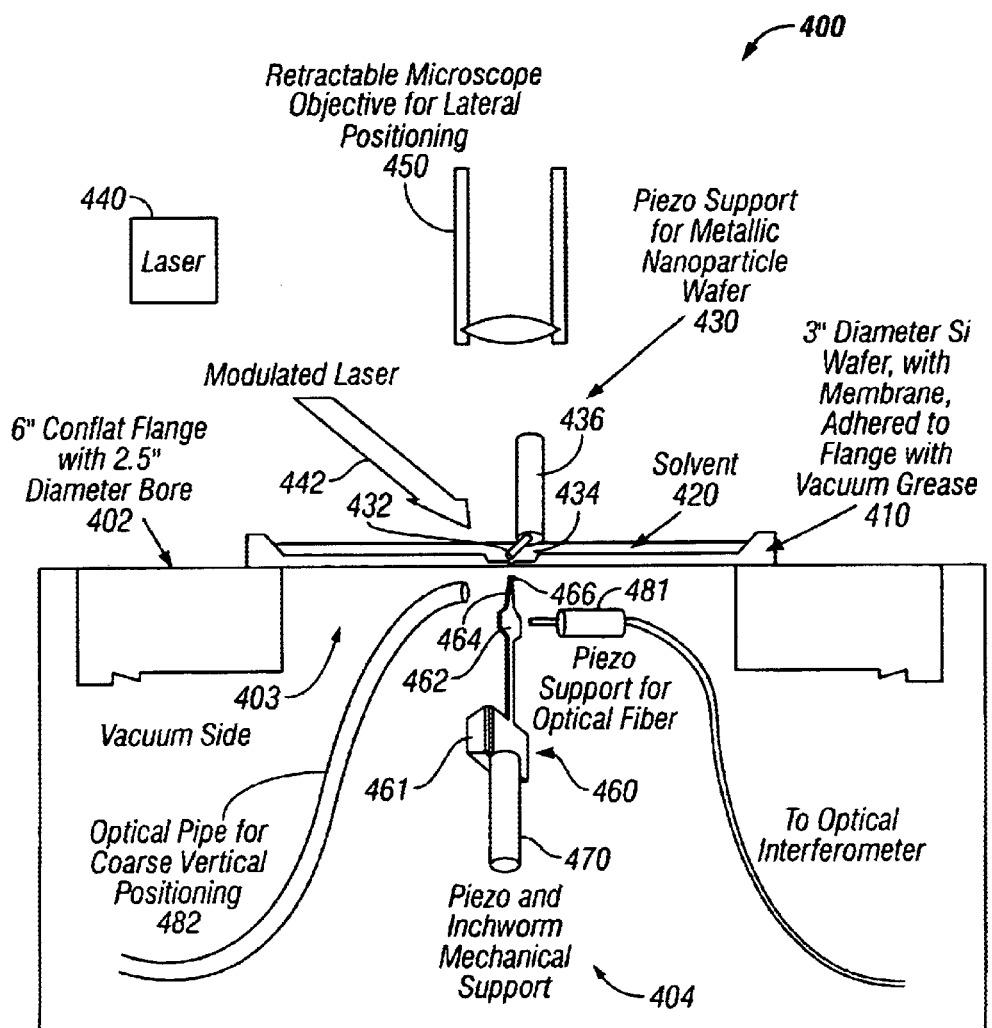
FIGS. 4, 4A, and 4B show one embodiment of a nanomechanical oscillator sensing system for measuring a sample under optical excitation.

FIG. 4 shows one embodiment of an EDDI system 400 for optically inducing forces at mechanical frequencies between a near-surface site and a nanoscale probe to provide spectroscopic measurements and imaging. The system 400 includes a vacuum chamber 401 with a flange 402 with an opening 403 for accommodating a mechanical oscillator probe 404. The opening 403 is sealed by engaging a sample holder 410 to the flange 402. Sample 420, such as a solvent containing the sample particles to be measured, is deposited in the sample holder 410 and is optically excited by a modulated laser beam 442 from a laser 440. The oscillator probe 404 in the vacuum chamber 401 is designed to have a probe tip 464 with a ferroelectric material 466, such as a PZT nanocrystal on CeO2 buffer, to be in a near-field position from a portion of the sample 420 to be measured. The interaction between the ferroelectric material 466 and mechanically relevant Fourier components of the optically-induced polarization in the sample 420 causes the oscillator probe 404 to oscillate or to change its oscillation property such as its frequency or amplitude. The vacuum chamber 401 keeps the oscillator probe 404 under a suitable vacuum condition to reduce any mechanical damping. A motion detection module 481, such as an optical interferometer positioning module, may be used to measure the position of the oscillator probe 404 to produce an output signal. A signal processing unit is then used to process the output signal to extract the properties or image of the sample 420.

The oscillator probe 404 includes a probe holder 460 and a probe positioning unit 470 which engages the probe holder 460 and controls the position of the probe tip 464 relative to the portion of the sample 420 that is under optical excitation. A piezo and inchworm mechanical support may be used to construct the probe positioning unit 470. The position data of the probe positioning unit 470 is recorded and fed to the signal processing unit to render the spatial image of the measured sample portion.

Figure 4A:
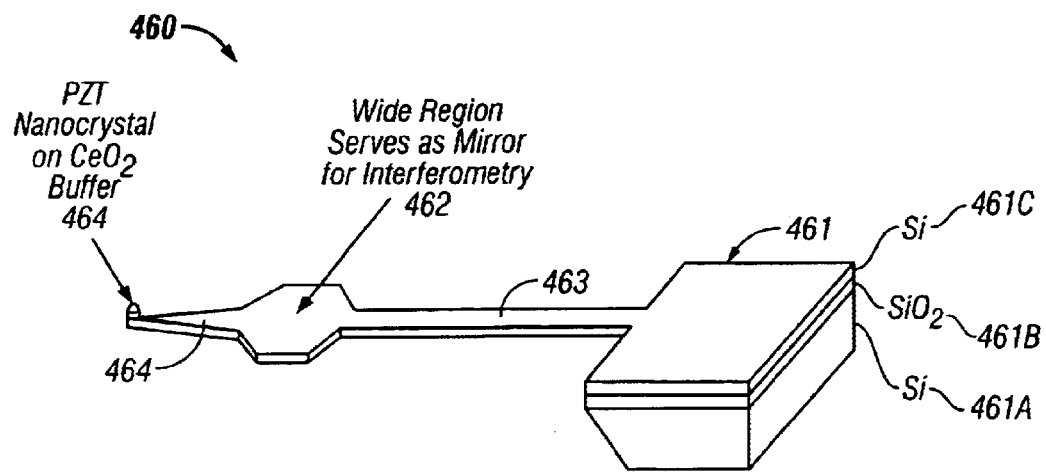

FIG. 4A shows additional details of the probe holder 460 under the illustrated embodiment. The probe holder 460 includes a base 461, a narrow arm 463, a wide reflector region 462, and the probe tip 464. The base 461 is formed over a silicon substrate 461A on which a probe base 461C is formed. The probe base 461C, the narrow arm 463, the wide reflector region 462, and the probe tip 464 may be formed from a single silicon layer formed over the substrate 461A. As illustrated, a dielectric layer 461B, such as silicon dioxide, may be formed between the silicon probe base 461C and the silicon base substrate 461A.

The optical interferometer detection module 481 is designed to deliver a monitor laser beam to the wide reflector region 462 and to receive the reflected light to obtain optical interference between the incident beam and the reflected beam. A change in this interference pattern can be processed to determine the position and position change of the reflector region 462. Another optical monitoring unit 482, such as an optical pipe, may be used to provide a coarse vertical positioning of the probe tip 464 relative to the sample 420.

Several distinct phenomena may play a role in this interaction. For example, frequency components of the sample polarization near the mechanical resonant frequency can drive the mechanical motion. Components much lower in frequency than the mechanical resonant frequency may, through interactions quadratic in the mechanical resonator coordinate, shift the frequency of the resonator, which may be separately driven in order to enhance the sensitivity with which its frequency can be detected. In addition, frequency components near twice the mechanical resonant frequency are also mechanically relevant causing frequency and/or amplitude changes known as parametric driving. Finally, the dissipation of the resonator energy may change with proximity to the sample, effecting its detected motion, and providing another probe of the sample's material properties.

Various manipulations of the sample and/or its geometrical relationship to the probe may be used to produce the mechanically relevant interactions described. An example is when the sample is irradiated with light in order to modify the mechanically relevant polarization properties described. In order to match the polarization changes of the sample to the frequencies optimum for their detection, the strength of the resonant interaction of the incident light with the energy levels of the sample can be manipulated. This manipulation can be made on the light field, for example, by frequency, amplitude, or polarization modulation. It can also be made on the sample, for example, by the modulation of an additional field which shifts the transition frequencies of the samples in and out of resonance with the light. The geometric relationship of the probe to the sample may itself be modulated, thereby modulating the forces of interaction at mechanically relevant frequencies, even in the absence of modulation of the samples polarization. These strategies may be combined by cyclically modulating the sample and the geometric relationship of the sample and the probe such that sums or differences of frequencies present in these two types of modulation are at the mechanically relevant frequencies of the probe.

On the non-vacuum side of the sample holder 410 where a portion of the sample 420 receives the modulated laser beam 442, the system 400 implements an optical excitation assisting unit 430 to enhance the local electric field of the modulated laser beam 442 at the portion of the sample 420 to be measured. An optically responsive material 432, such as a metallic nanoparticle, is engaged to a tip 432 to be placed in a vicinity of, e.g., in the near-field region of, the portion of the sample 420 to be measured. In addition to optical absorption of the laser beam 442 by the portion of the sample 420 to be measured to induce the polarization, the material 432 also interacts with the laser beam 442 to produce a strong electric field induced by the laser beam 442. This electric field, in turn, operates to polarize the nearby portions of the sample 420. Hence, the total optical field relevant to driving the optically-induced changes in the sample 420 to be measured is a sum of applied laser field and the local field of the optically responsive material 432. In implementation, the tip 432 may be a piece of a dielectric or semiconductor substrate on which a metal particle is attached. Alternatively, metallic particles may be dispensed into the sample 432 to enhance the local electric field.

The above nanoscale near-field enhancement may be used to obtain adequate signals without the excessive heating that would result from very high optical power dissipation over larger volumes. An array of nanoparticles with carefully tailored aspect ratios may be fabricated using electron beam lithography to achieve the local enhancement. In one implementation, molecules could be placed on a Si wafer with arrays of metallic nanoparticles. Such a wafer could be fixed and placed within the vacuum enclosure. For later imaging experiments on biological molecules, the flexibility may be afforded by having a separate probe with a metallic dot tip attached to independent nanopositioning manipulator. This probe might include dye molecules, allowing it to be imaged first or simultaneously to provide calibration for the imaging of biological molecules.

In addition, a retractable microscope objective lens 450 may be used in the system 400 in FIG. 4 to monitor the coarse lateral position of the oscillator probe 404.

Figure 4B:
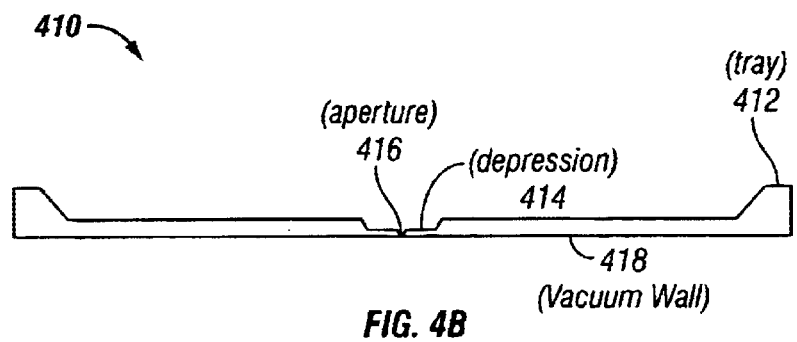

FIG. 4B shows additional details of the sample holder 410 which may be formed of a silicon tray and a dielectric vacuum wall 418 (e.g., a silicon nitride) with a thickness of about 20 nm. A depression or dip 414 may be formed in the central region of the silicon tray 412 and a small opening 416 in the dip 414 to expose a portion of the sample 420 to the oscillator probe 404 on the other aide of the vacuum wall 418 where the probe tip 464 places the material 466 in the near-field region of the polarization induced in the sample 420 in the dip 414. For imaging of biological molecules such as proteins, the subject molecules may be kept in a suitable solution to retain their characteristic properties. Since the cantilever needs to be in vacuum, imaging is performed through a thin vacuum wall.

In one implementation, a low-stress, LPCVD-grown, SixNy membrane with a thickness around 20 nm and lateral extent on the order of 10 microns may be used as the vacuum wall 418. A thick Si wafer may be used to form the silicon tray 412. A 20 nm thick SixNy layer may be deposited on this Si wafer using, e.g., the low-pressure chemical vapor deposition. This nitride layer may be coated with resist to protect it during subsequent processing. A timed KOH etch may be used to dish out the bulk of the Si wafer to form the tray 412 to hold the solvent. An adequate thickness of wafer, e.g., on the order of 100 microns, may be left to mechanically hold up under an atmosphere pressure over an area of several square inches. In the center of this large depression 414, a second timed KOH etch may be carried out to reduce the thickness of the Si wafer to approximately 10 microns over an area of a few square millimeters. This area is adequate to spin on and pattern photoresist within the depression 414 for a third KOH etch that will penetrate through the remaining Si to form the opening 416. The etching is stopped at the underlying $Si_xN_y$ layer 418. The protective resist is then removed by, e.g., using ozone cleaning, to leave a pristine nitride surface.

Due to interfacial chemistry concerns, there may be specimens for which Si or SiO2 surfaces are desired instead of SixNy. To obtain a Si membrane, a silicon-on-insulator (Si/oxide/Si) wafer with a 100-nm-thick top Si layer could be used as the starting point to fabricate the sample holder 410. The wafer could be thinned through from the backside, stopping at the oxide layer. This top Si layer could be thinned to around 20 nm using Si etching or oxidation followed by etching of the oxide layers in HF. The resulting Si membrane would have a native oxide unless it were treated with HF and kept under dry nitrogen, which would result in a hydrogen-terminated surface. Such surfaces are stable in vacuum, and so would be suitable for vacuum-compatible specimens. Another approach to obtaining an oxide surface would be oxidizing the silicon nitride membrane, as these naturally form Si rich.

The design of the system 400 in FIG. 4 is to optimize the force sensitivity and the generalized force at $\omega f$ near the resonance frequency $\omega h$ of the harmonic oscillator or another mechanically relevant frequency. The resonance condition $\omega f \approx \omega h$ allows for optimal excitation of the oscillator amplitude in proportion to the force of interaction. This frequency may be in the range of, e.g., from about 3 kHz to about 100 MHz in some applications. The system 400 may be designed to modulate the target dipoles to match any mechanical resonance frequency.

Figure 5A:
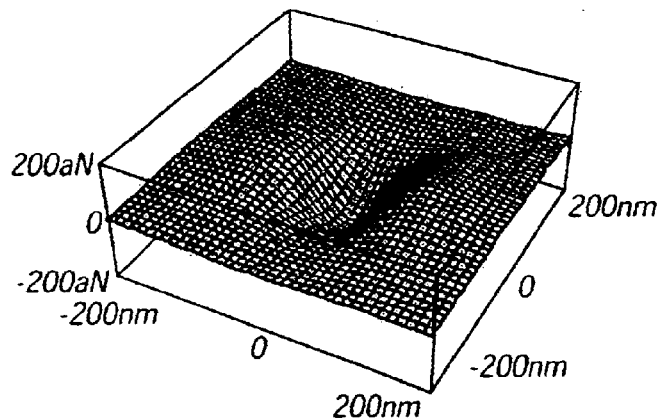
FIG. 5 shows three exemplary images obtained from the system in FIG. 4 based on a simulation.
Figure 5B:
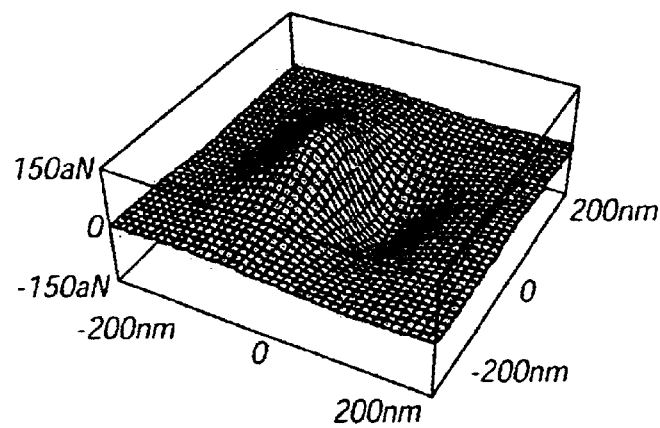
Figure 5C:
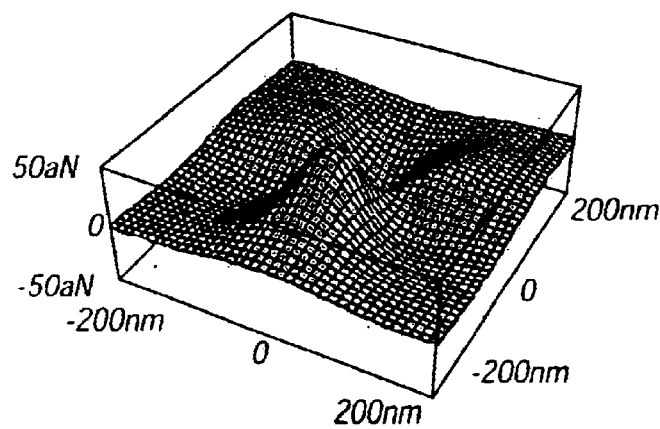

Imaging information may be obtained as a function of incident polarizations, transition dipole orientation, probe geometry and probe position. FIG. 5 illustrates three particular imaging configurations where a single-molecule target chromophore is located 40 nm from the surface of the scanning probe tip. The predicted force at the cantilever frequency is shown as a function of the x-y position of the probe for three orthogonal directions of the target dipole. The direction of the target dipole is indicated by the arrow on the schematic surface species at the right. The ferroelectric moment is the same (perpendicular to the surface of the cantilever) for parts a, b and c. The radius of the nominally spherical ferroelectric is 120 nm (not to scale). The amplitude of the sinusoidal component of the dipole is $10^{-3}$ debye, the smallest example considered.

Notably, the images for three orthogonal orientations of the chromophore are different. The vertical axes are labeled for the case of an effective signal dipole with peak-to-peak amplitude of only $10^{-3}$ debye. The forces of ~100 aN are comparable to the current best room-temperature noise force for a measurement time of about one second. An estimate is that observing each of 100 x-y pixels for 100 s would give adequate signal-to-noise ratio (SNR) to distinguish the absolute vector orientation of the chromophore to several degrees. The Stark shift of such an unfavorable chromophore would be within the error bars of the bulk absorption experiments which provide the best available information on the difference of the sample and the probe dipole moments for various electronic and vibrational transitions. For selected systems with difference of the sample and the probe dipole moments is greater than 1 debye, such single-molecule signals will be more than 100 fold stronger than illustrated in FIG. 1, reducing the total measurement time for such an observation to about 1 second with no change in the apparatus.

Another mode of operation of the sensors is for the detection of fields which are much lower in frequency than the mechanical resonance frequency. In the presence of an electric field, the potential energy as a function of the oscillator coordinate will in general contain terms quadratic in that coordinate and linear in the dipole moment of the sensor. For example, in the case of torsional motion, the field components which lie along the direction of the probes dipole moment at the angle of zero displacement interact with that dipole moment to create a quadratic restoring force. These quadratic interactions of the probe dipole with the electric field lead to frequency shifts of the oscillator. These shifts may be to higher or lower frequency depending on the sign of this interaction.

Hence, measurement of the frequency of the oscillator may include measurement of the field at the position of the probe dipole. Such measurement can be achieved by driving the oscillator with a variable frequency near-resonant field and upon detection of this motion as a function of the driving frequency extracting the central frequency. Alternatively, the mechanical resonator in question could be made part of an electrical oscillator circuit with gain so that its resonance frequency determines the frequency of sustained oscillation. This frequency can then be counted by an enumeration of voltage level crossings or extracted from a digitized record of the oscillation made with the detection methods already described.

Such a method could be an auxiliary method, using the EDDI apparatus of FIG. 4, for measuring the static electric field near the surface by mapping the resonant frequency of the probe oscillator as a function of its position in space or as a function of time as the sample is modified. Of particular interest is the case where the slow time dependence of the field is due to the binding of molecules in the adjacent sample holder 420 or some other chemical or physical change in the sample which changes the electric field at the probe.

The sensing of molecular binding by a device of a molecule from an ambient environment is sometimes described as an electronic nose. The various methods described can be implemented as an electronic nose by using a flow of liquid or gas to deliver the target molecules to sample holder. If the binding sites in the sample holder are designed to have an affinity for specific molecules, then these will contribute to the time-dependent electric fields sensed by the methods described. The occupancy kinetics of such binding sites will also be characteristic of particular target molecules and could be measured by the time dependence of the frequency shifts or EDDI signals. In such a mode of operation with specific binding sites, certain aspects of the device could be omitted in order to construct a simpler and smaller device. For example, the detection of the frequency of a small resonator 200 driven and detected electrically through the coupling to the electrodes and attached antenna segments and encapsulated in a vacuum wall could comprise a sensor of molecular binding events occurring at its outside surface. Such a device could be implanted, for example, in a living organism or other environment to allow minimally invasive monitoring of substances specific to the binding sites placed on its outside surface. Such a device would be passive, essentially requiring no power other than that supplied from the outside by an RF field that would excite the resonant motion. Sensing of the resonance frequency could take place by detecting with a radio receiver the broadcast waves emitted by the moving oscillator so driven.

It is evident from this simulated example that the methods described comprise a highly localized and chemically specific probe of materials with sensitivity adequate to detect even individual molecules at ambient temperatures. Much of analytical chemistry, in particular surface science, is concerned with the identification and quantification of molecular species. Such information is critical to environmental sensing, for example in the context of devices referred to as electronic noses, which draw samples from the environment into a sensor region. Such information is also of value in forensic science. The reading of information, including biological information such as encoded in the sequence of DNA and other biopolymer molecules, is another broad area of application for such a sensitive scanning probe method.

Only a few embodiments are disclosed. However, it is understood that variations and enhancements may be made without departing from the spirit of, and are intended to be encompassed by, the following claims.

What is claimed is:

1. A device, comprising:
    a micro mechanical oscillator exhibiting an electromagnetic polarization, wherein said electromagnetic polarization includes a static magnetic dipole moment;
    a circuit unit located adjacent to said micro oscillator to produce a temporally-changing electromagnetic signal in the space where said micro mechanical oscillator is located, wherein said electromagnetic polarization interacts with said electromagnetic signal to cause said micro mechanical oscillator to move; and
    a motion detection module to measure motion of said micro mechanical oscillator to produce a motion signal indicating a property of said electromagnetic signal.

2. The device as in claim 1, wherein said micro mechanical oscillator includes a ferromagnetic material which exhibits said static magnetic dipole moment.

3. The device as in claim 1, further comprising a plurality of additional micro mechanical oscillators each substantially identical to said micro mechanical oscillator to form an oscillator array that includes said micro mechanical oscillator and said plurality of additional micro mechanical oscillators, wherein said oscillator array interacts with said evanescent field to cause light transmitted through said fiber to have information on said property of said electromagnetic signal.

4. The device as in claim 1, further comprising a substrate, wherein said micro mechanical oscillator comprises:
two support units spaced from each other and formed on said substrate, and
a mechanical suspension comprising one end engaged to one of said two support units and another end engaged to another support unit, said mechanical suspension operable to oscillate around an axis.

5. A device, comprising:
a micro mechanical oscillator exhibiting an electromagnetic polarization, wherein said electromagnetic polarization includes a static electric dipole moment;
a circuit unit located adjacent to said micro oscillator to produce a temporally-changing electromagnetic signal in the space where said micro mechanical oscillator is located, wherein said electromagnetic polarization interacts with said electromagnetic signal to cause said micro mechanical oscillator to move; and
a motion detection module to measure motion of said micro mechanical oscillator to produce a motion signal indicating a property of said electromagnetic signal.

6. The device as in claim 5, wherein said micro mechanical oscillator includes a ferroelectric material which exhibits said static electric dipole moment.

7. The device as in claim 5, further comprising a plurality of additional micro mechanical oscillators each substantially identical to said micro mechanical oscillator to form an oscillator array that includes said micro mechanical oscillator and said plurality of additional micro mechanical oscillators, wherein said oscillator array interacts with said evanescent field to cause light transmitted through said fiber to have information on said property of said electromagnetic signal.

8. The device as in claim 5, further comprising a substrate, wherein said micro mechanical oscillator comprises:
two support unite spaced from each other and formed on said substrate, and
a mechanical suspension comprising one end engaged to one of said two support units and another end engaged to another support unit, said mechanical suspension operable to oscillate around an axis.

9. The device as in claim 5, wherein said motion detection module comprises:
a light source to produce an optical beam that illuminates at least a part of said micro mechanical oscillator; and
an optical detector located to receive light reflected or scattered from said micro mechanical oscillator to produce a defector signal as said motion signal.

10. The device as in claim 9, further comprising:
an optical waveguide to direct the optical beam from said light source to said micro mechanical oscillator and to guide at least a part of said light reflected or scattered from said micro mechanical oscillator to said optical detector.

11. A device, comprising:
a micro mechanical oscillator exhibiting an electromagnetic polarization,
a circuit unit located adjacent to said micro oscillator to produce a temporally-changing electromagnetic signal in the space where said micro mechanical oscillator is located, wherein said electromagnetic polarization interacts with said electromagnetic signal to cause said micro mechanical oscillator to move; and
a motion detection module to measure motion of said micro mechanical oscillator to produce a motion signal indicating a property of said electromagnetic signal, wherein said motion detection module comprises a light source to produce an optical beam that illuminates at least a part of said micro mechanical oscillator, and an optical detector located to receive light reflected or scattered from said micro mechanical oscillator to produce a detector signal as said motion signal,
wherein said motion detection module further includes a fiber that receives said optical beam and directs said optical beam to said optical detector,
wherein said fiber has a portion of fiber cladding removed to form an optical surface within an evanescent field of light guided in said fiber, and
wherein said micro mechanical oscillator is located relative to said optical surface to interact with said evanescent field to cause light transmitted through said fiber to have information on motion of said micro mechanical oscillator.

12. The device as in claim 11, wherein said circuit unit includes two electrodes spaced from each other and wherein said micro mechanical oscillator is located between said two electrodes.

13. The device as in claim 11, wherein said micro mechanical oscillator is a torsional oscillator that rotates around a rotational axis in response to a torque produced by an interaction between said electromagnetic polarization and said electromagnetic signal.

14. The device as in claim 11, further comprising a plurality of additional micro mechanical oscillators each substantially identical to said micro mechanical oscillator to form an oscillator array that includes said micro mechanical oscillator and said plurality of additional micro mechanical oscillators, wherein said oscillator array interacts with said evanescent field to cause light transmitted through said fiber to have information on said property of said electromagnetic signal.

15. The device as in claim 11, further comprising a plurality of additional micro mechanical oscillators each substantially identical to said micro mechanical oscillator to form an oscillator array that includes said micro mechanical oscillator and said plurality of additional micro mechanical oscillators, wherein said oscillator array are located to be illuminated by said optical beam to produce a scattered optical signal received by said optical detector.

16. The device as in claim 15, wherein said oscillator array is a linear array along the fiber core of said fiber.

17. The device as in claim 15, wherein said oscillator array is a two-dimensional array.

18. The device as in claim 11, wherein said micro mechanical oscillator has a mechanical resonance frequency approximately equal to a frequency of said electromagnetic signal.

19. The device as in claim 11, further comprising a substrate on which said micro mechanical oscillator is formed, wherein said micro mechanical oscillator includes:
two support units spaced from each other and formed on said substrate;
a mechanical suspension having one end engaged to one of said two support units and another end engaged to another support unit.

20. The device as in claim 19, wherein said mechanical suspension is formed of a material exhibiting said electromagnetic polarization.

21. The device as in claim 19, wherein said micro mechanical oscillator includes a layer of a material formed on said mechanical suspension, said material exhibiting said electromagnetic polarization.

22. The device as in claim 19, wherein said circuit unit is integrated on said substrate.

23. The device as in claim 11, wherein said micro mechanical oscillator comprises a ferromagnetic component which exhibits a static magnetic dipole moment.

24. The device as in claim 11, wherein said micro mechanical oscillator comprises a ferroelectric component which exhibits a static electric dipole moment.

25. The device as in claim 11, wherein said micro mechanical oscillator comprises a micro electromechanical system.

26. The device as in claim 11, wherein said micro mechanical oscillator comprises a suspension member and at least a portion of said suspension member exhibits said electromagnetic polarization.

27. The device as in claim 26, wherein said micro mechanical oscillator comprises an optically reflective surface that is fixed relative to said suspension member.

28. The device as in claim 11, further comprising a substrate, wherein said micro mechanical oscillator comprises:

two support units spaced from each other and formed on said substrate, and a mechanical suspension comprising one end engaged to one of said two support units and another end engaged to another support unit, said mechanical suspension operable to oscillate around an axis.

29. The device as in claim 28, wherein said mechanical suspension comprises a material exhibiting said electromagnetic polarization.

30. The device as in claim 28, wherein said micro mechanical oscillator comprises a layer of a material formed on said mechanical suspension, said material exhibiting said electromagnetic polarization.

31. The device as in claim 30, wherein said material is a ferroelecric material.

* * * * *